(12) United States Patent
Zhu et al.

(10) Patent No.: US 10,996,495 B2
(45) Date of Patent: May 4, 2021

(54) HIGH-RATE HIGH-SWING DRIVE CIRCUIT APPLIED TO SILICON PHOTONIC MODULATOR

(71) Applicant: HUAWEI TECHNOLOGIES CO., LTD., Guangdong (CN)

(72) Inventors: Wenrui Zhu, Shanghai (CN); David Zhang, Shanghai (CN); Lei Zhao, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 294 days.

(21) Appl. No.: 16/146,259

(22) Filed: Sep. 28, 2018

(65) Prior Publication Data
US 2019/0033629 A1    Jan. 31, 2019

Related U.S. Application Data

(63) Continuation of application No. PCT/CN2017/078417, filed on Mar. 28, 2017.

(30) Foreign Application Priority Data

Mar. 31, 2016 (CN) .......................... 201610200288.6

(51) Int. Cl.
*G02F 1/01* (2006.01)
*G02F 1/21* (2006.01)
*H03K 19/0948* (2006.01)

(52) U.S. Cl.
CPC .............. *G02F 1/0123* (2013.01); *G02F 1/21* (2013.01); *H03K 19/0948* (2013.01); *G02F 2001/212* (2013.01)

(58) Field of Classification Search
CPC .... G02F 1/0123; G02F 1/21; G02F 2001/212; G11C 11/419; G11C 11/418;
(Continued)

(56) References Cited

U.S. PATENT DOCUMENTS

2003/0128555 A1\* 7/2003 Schemmann ....... H02M 3/3385
363/16
2008/0054934 A1  3/2008 Jungert
(Continued)

FOREIGN PATENT DOCUMENTS

CN      101034887 A      9/2007
CN      101741373 A      6/2010
(Continued)

OTHER PUBLICATIONS

Zhou Yanyang, "High-speed Electrical Circuits for Silicon Achzehnder Electro-optic Modulators," China Excellent Master's Thesis Full-text Database, 201506 (91 pp.).
(Continued)

*Primary Examiner* — Brandi N Thomas
(74) *Attorney, Agent, or Firm* — Fish & Richardson P.C.

(57) ABSTRACT

A high-rate high-swing drive circuit applied to a silicon photonic modulator is disclosed. The drive circuit is connected to a drive pre-stage circuit and a modulator load. The drive circuit includes at least one output circuit, and the output circuit includes: a first inverter, a first voltage bias module, a second inverter, a second voltage bias module, and an inductor. The drive circuit formed by using such a circuit connection increases an output swing of a drive while ensuring a high rate.

11 Claims, 8 Drawing Sheets

(58) Field of Classification Search
CPC ........... G11C 5/063; G11C 5/145; G11C 7/02; G11C 7/12; G11C 8/08; G11C 8/14; H01L 2924/0002; H01L 2924/00; H01L 27/0218; H01L 27/0727; H01L 27/092; H01L 27/0928; H01L 27/1203; H01L 29/78
USPC .................................................. 359/254, 248
See application file for complete search history.

(56) References Cited

U.S. PATENT DOCUMENTS

| 2015/0062689 | A1 | 3/2015 | Doerr |
| 2016/0085133 | A1 | 3/2016 | Denoyer |
| 2016/0105166 | A1* | 4/2016 | Seo .................... H03K 5/13 327/399 |

FOREIGN PATENT DOCUMENTS

| CN | 103401614 A | 11/2013 |
| CN | 103716036 A | 4/2014 |
| CN | 105656473 A | 6/2016 |
| WO | 03021773 A1 | 3/2003 |

OTHER PUBLICATIONS

T. K. Woodward et al., "Modulator-Driver Circuits for Optoelectronic VLSI," IEEE Photonics Technology Letters, vol. 9, No. 6, Jun. 1997, pp. 839-841.
Office Action, dated Feb. 5, 2018, in Chinese Application No. 201610200288.6 (26 pp.).
International Search Report, dated May 22, 2017, in International Application No. PCT/CN2017/078417 (4 pp.).
Written Opinion of the International Searching Authority, dated May 22, 2017, in International Application No. PCT/CN2017/078417 (9 pp.).
Lee Benjamin G et al:"Monolithic Silicon Integration of Scaled Photonic Switch Fabrics, CMOS Logic, and Device Driver Circuits", Journal of Lightwaue Technology, IEEE, USA, vol. 32, No. 4, Feb. 1, 2014, pp. 743-751, XP011537147.
Cignoli Marco et al:"22.9 A 1310nm 3D-integrated silicon photonics Mach-Zehnder-based transmitter with 275mW multistage CMOS driver achieving 6dB extinction ratio at 25Gb/s", 2015 IEEE International Solid-State Circuits Conference—(ISSCC) Digest of Technical Papers, IEEE, Feb. 22, 2015, pp. 1-3, XP032748269.
McPherson D S et al:"A 3-V fully differential distributed limiting driver for 40-Gb/s optical transmission systems", IEEE Journal of Solid-State Circuits, IEEE, vol. 38, No. 9, Sep. 1, 2003, pp. 1485-1496. XP011100253.
European Office Action dated Feb. 21, 2019 issued in European Application No. 17773207.0.

* cited by examiner

HIGH-RATE HIGH-SWING DRIVE CIRCUIT APPLIED TO SILICON PHOTONIC MODULATOR

CROSS-REFERENCE TO RELATED APPLICATIONS

This application is a continuation of International Application No. PCT/CN2017/078417, filed on Mar. 28, 2017, which claims priority to Chinese Patent Application No. 201610200288.6, filed on Mar. 31, 2016. The disclosures of the aforementioned applications are hereby incorporated by reference in their entireties.

TECHNICAL FIELD

The present application relates to the field of communications technologies, and in particular, to a high-rate high-swing drive circuit applied to a silicon photonic modulator.

BACKGROUND

With the development of communications technologies, the demand for information is increasing exponentially in modern society. In short range communication, as a chip size decreases and a speed increases gradually, a conventional electric interconnection technology faces a series of bottlenecks such as an increased parasitic effect and limited transmission bandwidth. Because of advantages such as huge bandwidth and no mutual interference between different signals during transmission, an optical interconnection technology has become an ideal solution instead of metal interconnection. In the field of optical interconnection technologies, a silicon photonic technology is widely regarded as a key technology of a next generation.

Figure 1:
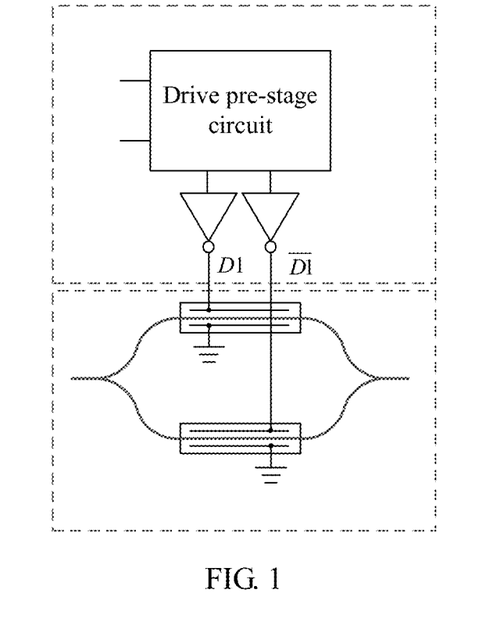
FIG. 1 is a schematic structural diagram of a drive circuit according to an embodiment of the present application.

Currently, increasingly more optical devices are manufactured by using the silicon photonic technology, and a silicon photonic modulator (the silicon photonic modulator is mainly a modulator made of silicon-based materials) is used as an example. In practice, it is found that a drive voltage that is input to the silicon photonic modulator is an important factor determining whether the silicon photonic modulator can work normally, and the drive voltage is closely related to an output voltage of a drive pre-stage circuit. Specifically, reference may be made to a drive circuit shown in FIG. 1. In FIG. 1, a drive pre-stage circuit outputs a pair of differential signals (D1 and $\overline{D1}$), separately transfers the pair of differential signals to an inverter, and respectively connects the two differential signals passing through the inverter to two plates of a silicon photonic modulator. As the inverter included in this drive circuit is mainly built by using a complementary metal-oxide-semiconductor (CMOS) transistor, a voltage loaded onto the silicon photonic modulator is limited to a maximum working voltage of the CMOS transistor. The maximum working voltage of the CMOS transistor is related to a process node of the CMOS transistor and a rate required by a system. For example, if a drive rate of 25 Gbps needs to be obtained, only an inverter built by using a CMOS core transistor less than 40 nm can meet such a rate requirement. For a process of a CMOS transistor less than 40 nm, a maximum working voltage of the CMOS transistor is only approximately 1 V. That is, an output drive voltage of a single-stage inverter is only approximately 1 V. If the method shown in FIG. 1 is loaded onto a silicon photonic modulator, a drive voltage is only two times a voltage output by an inverter, and is approximately 2 V. Therefore, it may be difficult to drive the silicon photonic modulator to work normally, because the drive voltage is excessively small. In practice, to resolve the foregoing problem that the drive voltage is too small to normally drive the silicon photonic modulator to work normally, some manners in which a quantity of drive plates is increased or multiple modulators are driven by multiple drives are used. However, these manners increase production complexity and costs. If a MOS transistor with a higher working voltage is used, a rate is greatly affected. Therefore, how to maintain a high rate while increasing an output voltage of a drive is an urgent problem to be resolved.

SUMMARY

Embodiments of the present application disclose a high-rate high-swing drive circuit applied to a silicon photonic modulator, so as to resolve a problem of how to maintain a high rate while increasing an output voltage of a drive.

A first aspect of the embodiments of the present application discloses a high-rate high-swing drive circuit applied to a silicon photonic modulator, where the drive circuit is connected to a drive pre-stage circuit and a modulator load, the drive circuit includes at least one output circuit, and the output circuit includes: a first inverter, a first voltage bias module, a second inverter, a second voltage bias module, and an inductor;

an input end of the first inverter is connected to an output end of the drive pre-stage circuit;

an output end of the first inverter is connected to an input end of the first voltage bias module;

an output end of the first voltage bias module is connected to an input end of the second inverter;

an output end of the second inverter is connected to an input end of the second voltage bias module;

an output end of the second voltage bias module is connected to an input end of the inductor; and an output end of the inductor is connected to an input end of the modulator load. By implementing the drive circuit, a swing of the output voltage of the drive can be increased.

With reference to the drive circuit of the first aspect, in a first possible drive circuit of the first aspect, the first inverter includes a core P-type metal-oxide semiconductor field-effect transistor PMOS and a core N-type metal-oxide semiconductor field-effect transistor NMOS, where a gate electrode of the core PMOS is connected to the output end of the drive pre-stage circuit and a gate electrode of the core NMOS;

a drain electrode of the core PMOS is connected to a drain electrode of the core NMOS and the input end of the first voltage bias module;

a source electrode of the core PMOS is connected to a first power supply;

the gate electrode of the core NMOS is connected to the output end of the drive pre-stage circuit;

the drain electrode of the core NMOS is connected to the input end of the first voltage bias module; and a source electrode of the core NMOS is grounded.

With reference to the first possible drive circuit of the first aspect, in a second possible drive circuit of the first aspect, the first voltage bias module includes a first capacitor and a first resistor;

a first end of the first capacitor is connected to the drain electrode of the core PMOS and the drain electrode of the core NMOS; and a second end of the first capacitor is connected to a first end of the first resistor and the input end of the second inverter, and a second end of the first resistor is connected to a first bias voltage.

With reference to the second possible drive circuit of the first aspect, in a third possible drive circuit of the first aspect, the second inverter includes: an input/output P-type metal-oxide semiconductor field-effect transistor I/O PMOS and an input/output N-type metal-oxide semiconductor field-effect transistor I/O NMOS;

a gate electrode of the I/O PMOS is connected to the second end of the first capacitor, the first end of the first resistor, and a gate electrode of the I/O NMOS;

a drain electrode of the I/O PMOS is connected to the input end of the second voltage bias module and a drain electrode of the I/O NMOS;

a source electrode of the I/O PMOS is connected to a second power supply;

the gate electrode of the I/O NMOS is connected to the second end of the first capacitor and the first end of the first resistor; and the drain electrode of the I/O NMOS is connected to the input end of the second voltage bias module, and a source electrode of the I/O NMOS is grounded. The second inverter is introduced herein. Because an I/O MOS transistor used by the second inverter has a higher withstanding voltage, a supply voltage of the second inverter is higher, so that the second inverter can output a high-swing voltage.

With reference to the third possible drive circuit of the first aspect, in a fourth possible drive circuit of the first aspect, the second voltage bias module includes a second capacitor and a second resistor;

a first end of the second capacitor is connected to the drain electrode of the I/O PMOS and the drain electrode of the I/O NMOS;

a second end of the second capacitor is connected to a first end of the second resistor and the input end of the inductor; and a second end of the second resistor is connected to a second bias voltage.

With reference to any one of the drive circuit of the first aspect, the first possible drive circuit of the first aspect, the second possible drive circuit of the first aspect, the third possible drive circuit of the first aspect, and the fourth possible drive circuit of the first aspect, in a fifth possible drive circuit of the first aspect, the first inverter is configured to buffer an output signal of the drive pre-stage circuit.

With reference to the fifth possible drive circuit of the first aspect, in a sixth possible drive circuit of the first aspect, the first voltage bias module is configured to adjust a bias voltage of an amplified signal that is amplified by the first inverter.

With reference to the fifth possible drive circuit of the first aspect or the sixth possible drive circuit of the first aspect, in a seventh possible drive circuit of the first aspect, the second inverter is configured to amplify a signal obtained after the first voltage bias module performs bias processing.

With reference to the seventh possible drive circuit of the first aspect, in an eighth possible drive circuit of the first aspect, the second voltage bias module is configured to adjust a bias voltage of a buffered signal that is output by the second inverter and on which buffer processing is performed.

With reference to any one of the first possible drive circuit of the first aspect, the second possible drive circuit of the first aspect, and the third possible drive circuit of the first aspect, in a ninth possible drive circuit of the first aspect, a working voltage value of the first power supply is less than a working voltage value of the second power supply.

With reference to the ninth possible drive circuit of the first aspect, in a tenth possible drive circuit of the first aspect, the inductor includes at least one of an inductor built in a chip or a parasitic inductor generated by means of package.

With reference to the tenth possible drive circuit of the first aspect, in an eleventh possible drive circuit of the first aspect, the inductor is configured to form an LC bandwidth extension circuit with the modulator load, so as to perform bandwidth extension. LC bandwidth extension is formed by combining the inductor with the modulator load (such as a capacitor of an MZM), so that bandwidth of an I/O inverter can be extended, thereby ensuring a high rate of the drive.

The drive circuit disclosed in the embodiments of the present application is connected to the drive pre-stage circuit and the modulator load. The drive circuit includes at least one output circuit, and the output circuit includes: the first inverter, the first voltage bias module, the second inverter, the second voltage bias module, and the inductor. The input end of the first inverter is connected to the output end of the drive pre-stage circuit; the output end of the first inverter is connected to the input end of the first voltage bias module; the output end of the first voltage bias module is connected to the input end of the second inverter; the output end of the second inverter is connected to the input end of the second voltage bias module; the output end of the second voltage bias module is connected to the input end of the inductor; and the output end of the inductor is connected to the input end of the modulator load. In the embodiments of the present application, a signal output by the drive pre-stage circuit is amplified and buffered, and a full-scale digital signal that is output enters the first inverter. The first inverter performs further buffering. A signal output by the first inverter passes through the first voltage bias module, and is biased to a proper first bias voltage. An output signal of the first voltage bias module is further amplified by the second inverter, passes through the inductor, and is loaded onto a finally required modulator load. The drive circuit formed by using such a circuit connection can increase an output swing of the drive while ensuring a high rate.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. Apparently, the described embodiments are merely a part rather than all of the embodiments of the present application. All other embodiments obtained by a person of ordinary skill in the art based on the embodiments of the present application without creative efforts shall fall within the protection scope of the present application.

Embodiments of the present application disclose a high-rate high-swing drive circuit applied to a silicon photonic modulator. In the embodiments of the present application, a signal output by a drive pre-stage circuit is amplified and buffered, and a full-scale digital signal that is output enters a first inverter. The first inverter performs further buffering. A signal output by the first inverter passes through a first voltage bias module, and is biased to a proper first bias voltage. An output signal of the first voltage bias module is further amplified by a second inverter, passes through an inductor, and is loaded onto a finally required modulator load. The drive circuit formed by using such a circuit connection can increase an output swing of a drive while ensuring a high rate. For details, refer to the following detailed descriptions of FIG. 2 to FIG. 10.

Figure 2:
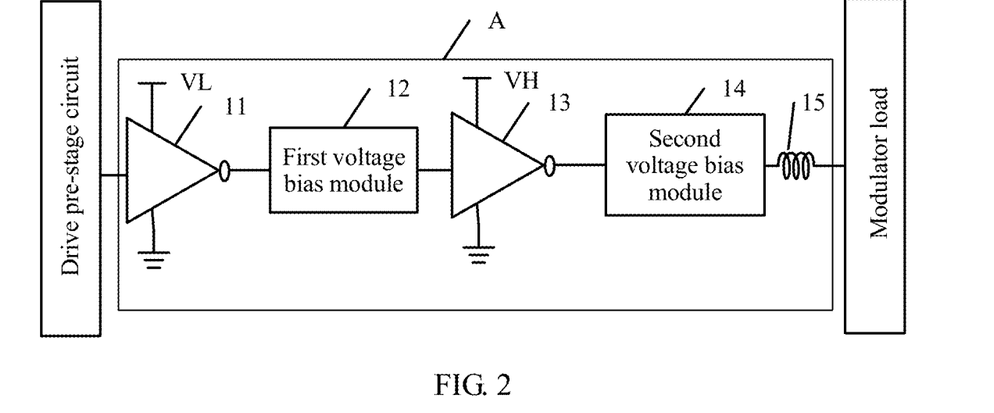
FIG. 2 is a schematic structural diagram of a high-rate high-swing drive circuit applied to a silicon photonic modulator according to an embodiment of the present application.

Referring to FIG. 2, FIG. 2 is a schematic structural diagram of a high-rate high-swing drive circuit applied to a silicon photonic modulator according to an embodiment of the present application. As shown in FIG. 2, the drive circuit is connected to a drive pre-stage circuit and a modulator load. The drive circuit includes at least one output circuit A, and the output circuit A includes: a first inverter 11, a first voltage bias module 12, a second inverter 13, a second voltage bias module 14, and an inductor 15.

An input end of the first inverter 11 is connected to an output end of the drive pre-stage circuit.

An output end of the first inverter 11 is connected to an input end of the first voltage bias module 12.

An output end of the first voltage bias module 12 is connected to an input end of the second inverter 13.

An output end of the second inverter 13 is connected to an input end of the second voltage bias module 14.

An output end of the second voltage bias module 14 is connected to an input end of the inductor 15.

An output end of the inductor 15 is connected to an input end of the modulator load.

In this embodiment of the present application, the first inverter is connected to a first power supply VL, the second inverter is connected to a second power supply VH, and a working voltage of the first power supply VL is less than a working voltage of the second power supply VH.

Figure 3:
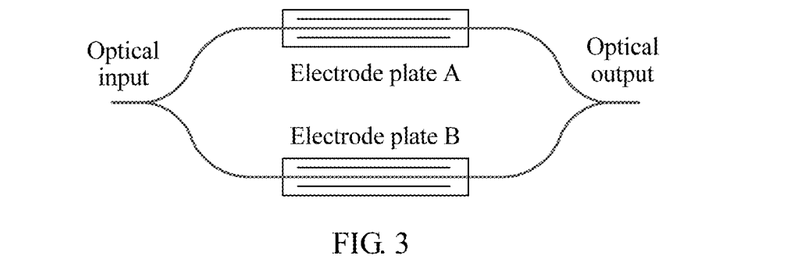
FIG. 3 is a schematic structural diagram of an MZM according to an embodiment of the present application.

In this embodiment of the present application, a main function of the drive pre-stage circuit is to output a signal, and the drive pre-stage circuit may be connected to the modulator load by using the drive circuit. The following uses a Mach-Zehender modulator (MZM) as an example to describe a structure of a modulator load in detail. Referring to FIG. 3, FIG. 3 is a schematic structural diagram of an MZM according to an embodiment of the present application. As shown in FIG. 3, the MZM includes an optical input end, an optical output end, an electrode plate A (positive electrode), and an electrode plate B (negative electrode). An optical signal is equally divided into two signals after being input to the optical input end. That is, the two signals respectively pass through an optical tributary (a first optical tributary) in which the electrode plate A is located and an optical tributary (a second optical tributary) in which the electrode plate B is located. The two optical tributaries finally converge into one optical path, and the two signals converge at the optical output end and are output.

Specifically, the electrode plate A and the electrode plate B are mainly connected to a voltage output by the drive circuit, and voltages loaded onto the electrode plate A and the electrode plate B affect a working status of the MZM. That is, when a voltage loaded onto the electrode plate A is different from a voltage loaded onto the electrode plate B, a phase of an optical signal passing through the first optical tributary is different from a phase of an optical signal passing through the second optical tributary. Specifically, when the voltage loaded onto the electrode plate A is the same as the voltage loaded onto the electrode plate B, the phase of the optical signal passing through the first optical tributary is the same as the phase of the optical signal passing through the second optical tributary. In this case, the MZM provides a function of increasing strength of the optical signal. When the voltage loaded onto the electrode plate A is different from the voltage loaded onto the electrode plate B, there is a phase difference between the phase of the optical signal passing through the first optical tributary and the phase of the optical signal passing through the second optical tributary. In this case, the MZM provides a function of decreasing the strength of the optical signal. If the phase difference between the phase of the optical signal passing through the first optical tributary and the phase of the optical signal passing through the second optical tributary is 180 degrees, the optical signal is exactly canceled after passing through the MZM (that is, the strength of the optical signal becomes 0). The MZM adjusts the strength of the optical signal according to this principle.

In this embodiment of the present application, the drive circuit is connected to the drive pre-stage circuit and the modulator load. The drive circuit includes at least one output circuit, and the output circuit includes: the first inverter 11, the first voltage bias module 12, the second inverter 13, the second voltage bias module 14, and the inductor 15. The input end of the first inverter 11 is connected to the output end of the drive pre-stage circuit. The output end of the first inverter 11 is connected to the input end of the first voltage bias module 12. The output end of the first voltage bias module 12 is connected to the input end of the second inverter 13. The output end of the second inverter 13 is connected to the input end of the second voltage bias module 14. The output end of the second voltage bias module 14 is connected to the input end of the inductor 15. The output end of the inductor 15 is connected to the input end of the modulator load. The first inverter 11 is mainly configured to buffer the signal output by the drive pre-stage circuit. The first voltage bias module 12 is mainly configured to adjust a bias voltage of the signal buffered by the first inverter 11. The second inverter 13 is mainly configured to amplify a signal adjusted by the first voltage bias module 12. The second voltage bias module 14 is mainly configured to adjust a bias voltage of a signal amplified by the second inverter 13. It can be learned that the drive circuit formed by using such a circuit connection can increase an output swing of a drive while ensuring a high rate.

Further, in this embodiment of the present application, only one output circuit is provided. However, in an actual application, a quantity of output circuits may be determined according to a drive voltage required by a drive load, an output voltage of the drive pre-stage circuit, and a circuit structure of the output circuit. That is, the quantity of output circuits may be set according to a requirement, and the output circuit may also perform output in a form of an output circuit pair (differential signals).

Figure 4:
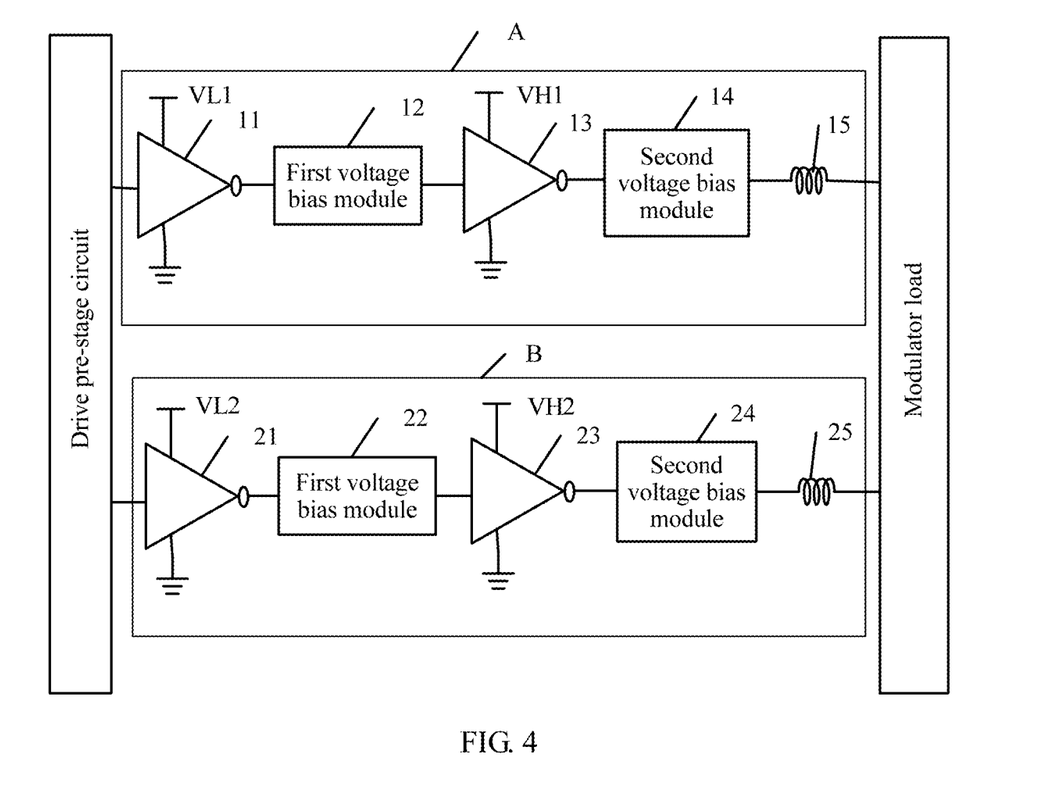
FIG. 4 is a schematic structural diagram of another high-rate high-swing drive circuit applied to a silicon photonic modulator according to an embodiment of the present application.

Specifically, referring to FIG. 4, FIG. 4 is a schematic structural diagram of another high-rate high-swing drive circuit applied to a silicon photonic modulator according to an embodiment of the present application. FIG. 4 is further refined on the basis of FIG. 2, and in addition to the output circuit A shown in FIG. 2, an output circuit B may further be included. The output circuit B includes a third inverter 21, a third voltage bias module 22, a fourth inverter 23, a fourth voltage bias module 24, and an inductor 25.

An input end of the third inverter 21 is connected to an output end of the drive pre-stage circuit.

An output end of the third inverter 21 is connected to an input end of the third voltage bias module 22.

An output end of the third voltage bias module 22 is connected to an input end of the fourth inverter 23.

An output end of the fourth inverter 23 is connected to an input end of the fourth voltage bias module 24.

An output end of the fourth voltage bias module 24 is connected to an input end of the inductor 25.

An output end of the inductor 25 is connected to an input end of the modulator load.

It should be noted that the inductor 15 and the inductor 25 are inductors that are respectively located in different circuits, and their corresponding input ends and output ends are connected to different positions. Specifically, the input end of the inductor 15 is connected to the output end of the second voltage bias module 14, and the input end of the inductor 25 is connected to the output end of the fourth voltage bias module 24. When the output circuit A and the output circuit B are a pair of differential circuits, the output end of the inductor 15 may be connected to a plate A of the modulator load, and the output end of the inductor 25 may be connected to a plate B of the modulator load. Certainly, the foregoing is only one of connection manners. Whether the output ends of the inductor 15 and the inductor 25 are connected to the plate A or the plate B of the modulator load is closely related to a connection relationship between the input end of the first inverter 11 and the drive pre-stage circuit and a connection relationship between the third inverter 21 and the drive pre-stage circuit. The foregoing connection relationship is used when the input end of the first inverter 11 is connected to a positive electrode of the drive pre-stage circuit and the input end of the third inverter 21 is connected to a negative electrode of the drive pre-stage circuit.

In this embodiment of the present application, the first inverter 11 is connected to a first power supply VL1, the second inverter 13 is connected to a second power supply VH1, the third inverter 21 is connected to a third power supply VL2, and the fourth inverter 23 is connected to a fourth power supply VH2. A working voltage of the first power supply VL1 is less than a working voltage of the second power supply VH1, and a working voltage of the third power supply VL2 is less than a working voltage of the fourth power supply VH2. It should be noted that the first power supply VL1 described herein is the same power supply as the first power supply VL described in FIG. 2, and the second power supply VH1 is the same power supply as the second power supply VH described in FIG. 2. The two power supplies are renamed herein to be distinguished from the third power supply VL2 and the fourth power supply VH2.

Figure 5:
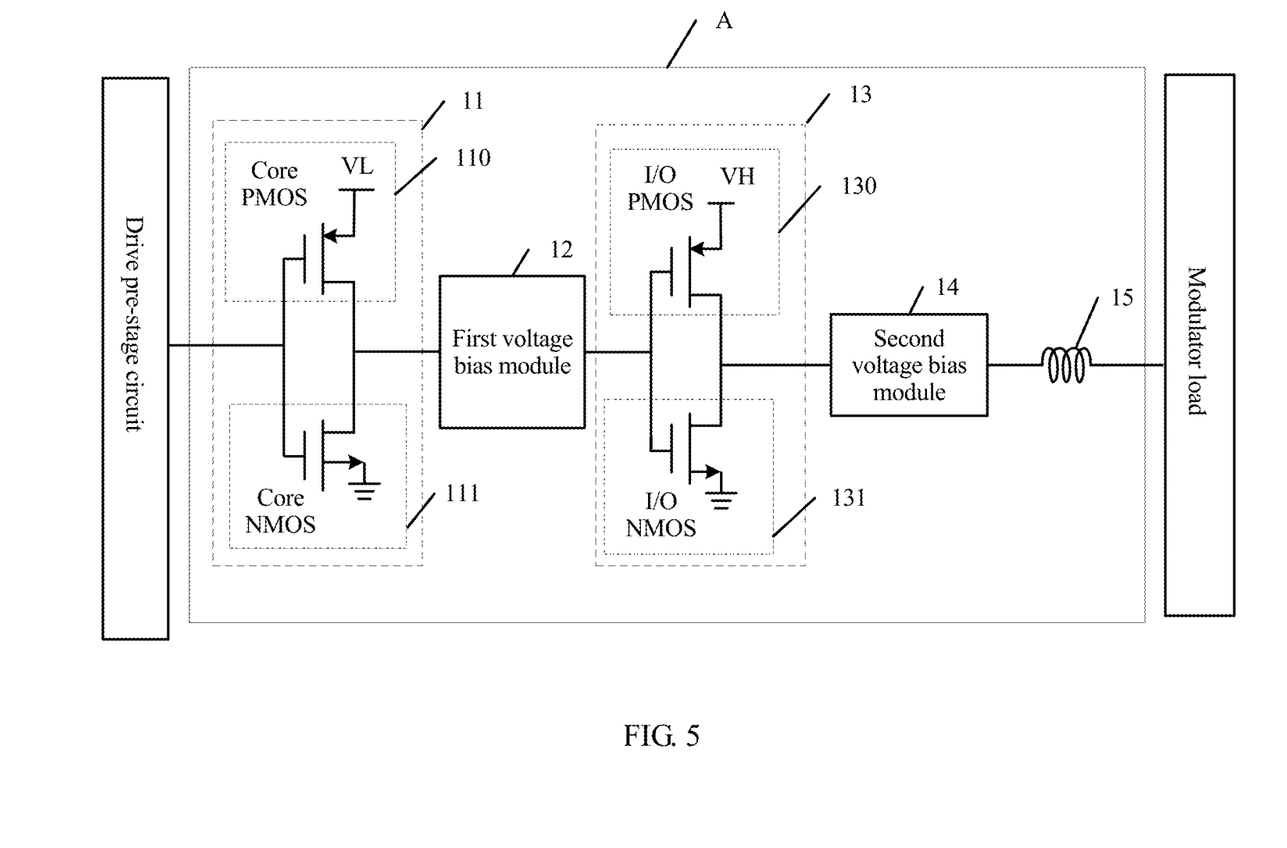
FIG. 5 is a schematic structural diagram of still another high-rate high-swing drive circuit applied to a silicon photonic modulator according to an embodiment of the present application.

Referring to FIG. 5, FIG. 5 is a schematic structural diagram of still another high-rate high-swing drive circuit applied to a silicon photonic modulator according to an embodiment of the present application. FIG. 5 is further refined on the basis of FIG. 2. As shown in FIG. 5, the first inverter 11 includes a core P-type metal-oxide semiconductor field-effect transistor PMOS 110 and a core N-type metal-oxide semiconductor field-effect transistor NMOS 111, and the second inverter 13 includes an input/output P-type metal-oxide semiconductor field-effect transistor I/O PMOS 130 and an input/output N-type metal-oxide semiconductor field-effect transistor I/O NMOS 131.

A gate electrode of the core PMOS 110 is connected to the output end of the drive pre-stage circuit and a gate electrode of the core NMOS 111.

A drain electrode of the core PMOS 110 is connected to a drain electrode of the core NMOS 111 and the input end of the first voltage bias module 12.

A source electrode of the core PMOS 110 is connected to the first power supply VL.

The gate electrode of the core NMOS 111 is connected to the output end of the drive pre-stage circuit.

The drain electrode of the core NMOS 111 is connected to the input end of the first voltage bias module 12.

A source electrode of the core NMOS 111 is grounded.

A gate electrode of the I/O PMOS 130 is connected to the output end of the first voltage bias module 12 and a gate electrode of the I/O NMOS 131.

A drain electrode of the I/O PMOS 130 is connected to the input end of the second voltage bias module 14 and a drain electrode of the I/O NMOS 131.

A source electrode of the I/O PMOS 130 is connected to the second power supply VH.

The gate electrode of the I/O NMOS 131 is connected to the output end of the first voltage bias module 12.

The drain electrode of the I/O NMOS 131 is connected to the input end of the second voltage bias module 14, and a source electrode of the I/O NMOS 131 is grounded.

The output end of the second voltage bias module 14 is connected to the input end of the inductor 15.

In this embodiment of the present application, the first inverter 11 is configured to buffer an output signal of the drive pre-stage circuit.

In this embodiment of the present application, the first voltage bias module 12 is configured to adjust a bias voltage of an amplified signal that is amplified by the first inverter 11.

In this embodiment of the present application, the second inverter 13 is configured to amplify a bias voltage obtained after the first voltage bias module 12 performs bias processing. The second inverter 13 uses an I/O inverter. Because an I/O MOS transistor used by the second inverter 13 has a higher withstanding voltage, a supply voltage of the second inverter 13 is higher, so that the second inverter 13 can output a high-swing voltage.

In this embodiment of the present application, the second voltage bias module 14 is configured to adjust a bias voltage of a buffered signal that is output by the second inverter 13 and on which buffer processing is performed.

In this embodiment of the present application, a working voltage value of the first power supply VL is less than a working voltage value of the second power supply VH.

In this embodiment of the present application, the inductor 15 includes at least one of an inductor built in a chip or a parasitic inductor generated by means of package.

In this embodiment of the present application, the inductor 15 is configured to form an LC bandwidth extension circuit with the modulator load, so as to extend bandwidth of the I/O inverter, thereby ensuring a high rate of a drive.

Figure 6:
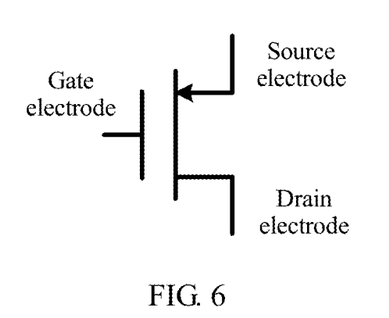
FIG. 6 is a schematic diagram of a circuit symbol of a metal-oxide semiconductor field-effect transistor according to an embodiment of the present application.

In this embodiment of the present application, for a structure of a gate electrode, a source electrode, and a drain electrode of a metal-oxide semiconductor field-effect transistor, further refer to FIG. 6. FIG. 6 is a schematic diagram of a circuit symbol of a metal-oxide semiconductor field-effect transistor according to an embodiment of the present application. The source electrode of the metal-oxide semiconductor field-effect transistor is configured to connect to a power supply.

Figure 7:
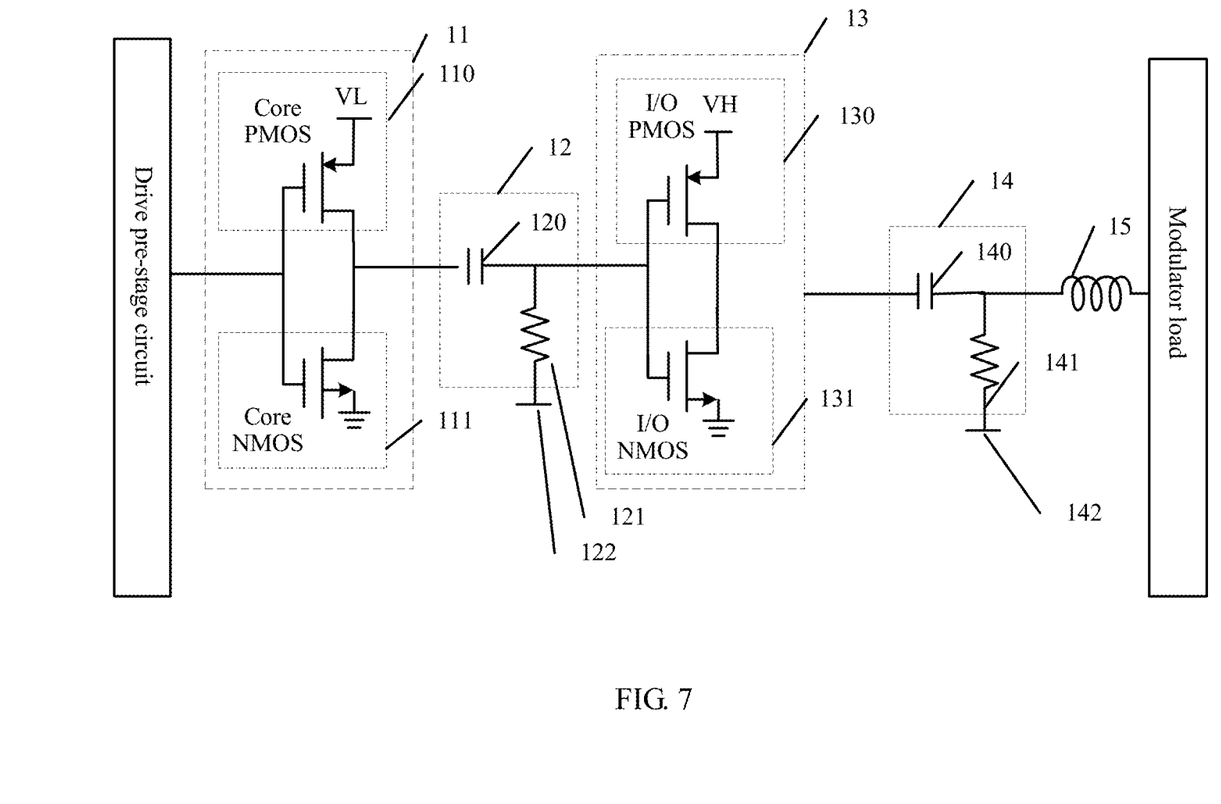
FIG. 7 is a schematic structural diagram of still another high-rate high-swing drive circuit applied to a silicon photonic modulator according to an embodiment of the present application.

In an embodiment of the present application, for ease of description, referring to FIG. 7, FIG. 7 is a schematic structural diagram of still another high-rate high-swing drive circuit applied to a silicon photonic modulator according to an embodiment of the present application. FIG. 7 is further refined on the basis of FIG. 5. In addition to all the electronic components shown in FIG. 5, FIG. 7 may be further refined as follows: The first voltage bias module 12 includes a first capacitor 120 and a first resistor 121, and the second voltage bias module 14 includes a second capacitor 140 and a second resistor 141.

A first end of the first capacitor 120 is connected to the drain electrode of the core PMOS 110 and the drain electrode of the core NMOS 111.

A second end of the first capacitor 120 is connected to a first end of the first resistor 121 and the input end of the second inverter 13, and a second end of the first resistor 121 is connected to a first bias voltage 122.

A first end of the second capacitor 140 is connected to the drain electrode of the I/O PMOS 130 and the drain electrode of the I/O NMOS 131.

A second end of the second capacitor 140 is connected to a first end of the second resistor 141 and the input end of the inductor 15.

A second end of the second resistor 141 is connected to a second bias voltage 142.

In this embodiment of the present application, the second voltage bias module 14 may alternatively be a connection line, that is, whether to dispose the second voltage bias module 14 may be determined according to a requirement.

Specifically, as shown in FIG. 7, the drive circuit shown in FIG. 7 includes two types of metal-oxide semiconductor field-effect transistors (Metal-Oxide-Semiconductor, MOS), that is, a high-rate core MOS and a high-voltage input/output metal-oxide semiconductor field-effect transistor (Input/Output Metal-Oxide-Semiconductor, I/O MOS). The core MOS includes a core P-type MOS (core PMOS) and a core N-type MOS (core NMOS), and the I/O MOS includes an input/output P-type metal-oxide semiconductor field-effect transistor I/O PMOS and an input/output N-type metal-oxide semiconductor field-effect transistor I/O NMOS. According to different "channel" polarity, the metal-oxide semiconductor field-effect transistors may be classified into an N-channel type with a majority of electrons and a P-channel type with a majority of holes, which are generally referred to as an N-type metal-oxide semiconductor field-effect transistor and a P-type metal-oxide semiconductor field-effect transistor.

In the technical solution used in the drive circuit disclosed in this embodiment of the present application, the first inverter 11 (for example, a core inverter) built by using a core MOS transistor performs amplification and driving, and then the first voltage bias module 12 performs first bias processing to obtain a first proper working point and drive the second inverter 13 (for example, an I/O inverter) built by using a high-voltage I/O MOS transistor, so as to output a high drive voltage; then, the second voltage bias module 14 performs second bias processing. Although having a low output voltage, the core MOS transistor inverter has a high rate and is suitable for driving the second inverter (for example, the I/O inverter). The I/O MOS transistor has a high withstanding voltage, and a supply voltage of the I/O MOS transistor can be high, so that an output voltage of the I/O MOS transistor is high. Therefore, the second inverter (for example, the I/O inverter) is suitable for serving as an output stage. However, the second inverter (for example, the I/O inverter) has a relatively low rate and insufficient bandwidth, but required bandwidth may be obtained by adjusting an inductance value of the inductor 15 and generating bandwidth extension by using the inductor 15 and a capacitor load of the modulator load. Specifically, a higher output swing is output by using the core inverter to drive the I/O inverter. In addition, an LC bandwidth extension technology is used to extend the bandwidth of the I/O inverter, thereby ensuring a high rate of a drive.

For example, if the output signal of the drive pre-stage circuit is an analog signal whose amplitude is 200 mV to 800 mV, the signal is amplified and buffered by the drive pre-stage circuit, and a full-scale digital signal is output to the first inverter 11. The first inverter 11 performs further buffering. An output signal of the first inverter 11 passes through the first voltage bias module 12, and is biased to a proper first bias voltage 122. Generally, a value of the first bias voltage 122 is half the working voltage value of the second power supply VH. An output signal of the first voltage bias module 12 is further amplified by the second inverter 13, passes through the inductor 15, and is loaded onto a finally required modulator load.

Figure 8:
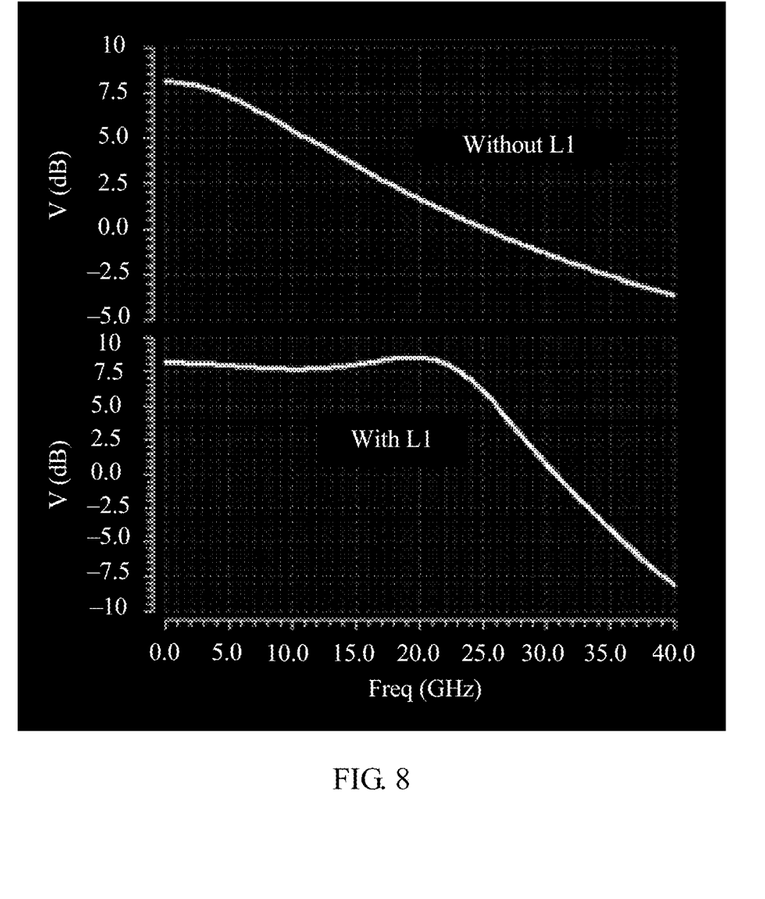
FIG. 8 is a schematic diagram of bandwidth according to an embodiment of the present application.
Figure 9:
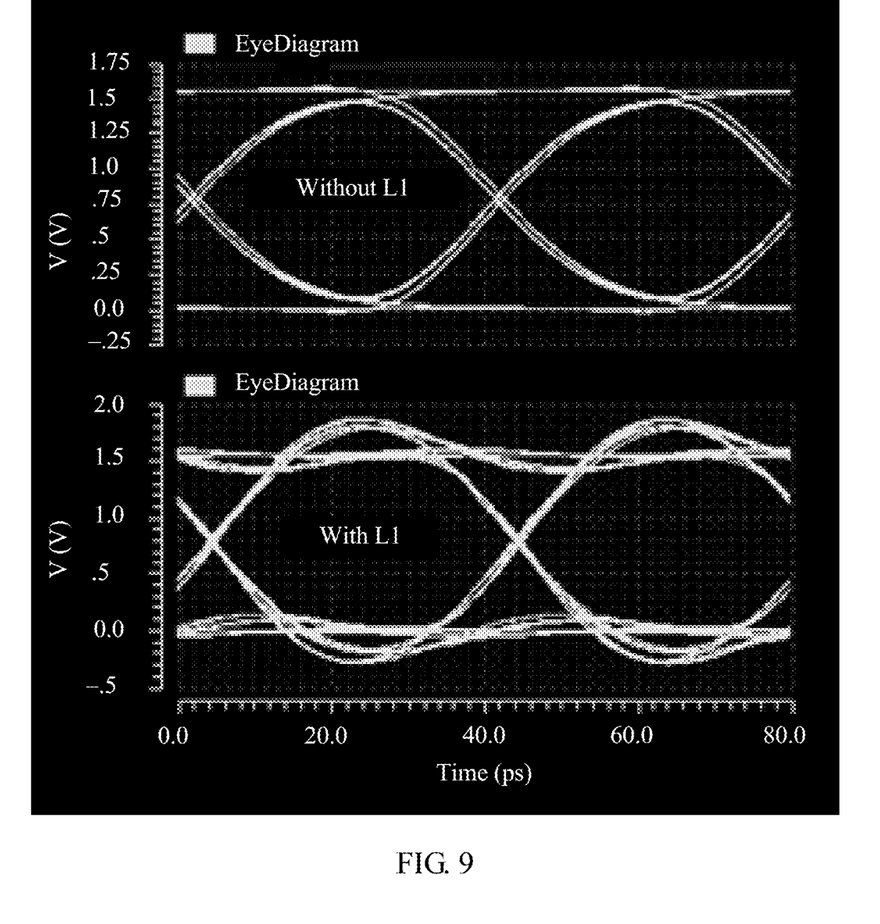
FIG. 9 is a schematic diagram of an eye diagram of bandwidth shown in FIG. 8.

In this embodiment of the present application, the bandwidth of the second inverter 13 cannot meet a bandwidth requirement of an application. However, required bandwidth may be obtained by using the inductor 15 and an internal capacitor of the modulator load to perform bandwidth extension. Referring to FIG. 8 and FIG. 9, FIG. 8 is a schematic diagram of bandwidth according to an embodiment of the present application, and FIG. 9 is a schematic diagram of an eye diagram of bandwidth shown in FIG. 8. It can be seen from FIG. 8 and FIG. 9 that a bandwidth extension function of an inductor may be used to extend output bandwidth from approximately 10 GHz to approximately 25 GHz. It can be seen from comparison between FIG. 8 and FIG. 9 that, when the inductor 15 is not connected, the output eye diagram rises and falls slowly, and the eye diagram is not full. When the inductor 15 is connected, rise and fall time decreases, and the eye diagram is full. When there is the inductor 15, although the eye diagram has upward and downward peaks, these peaks do not affect performance, so long as the peaks are controlled to be within a specific range.

Figure 10:
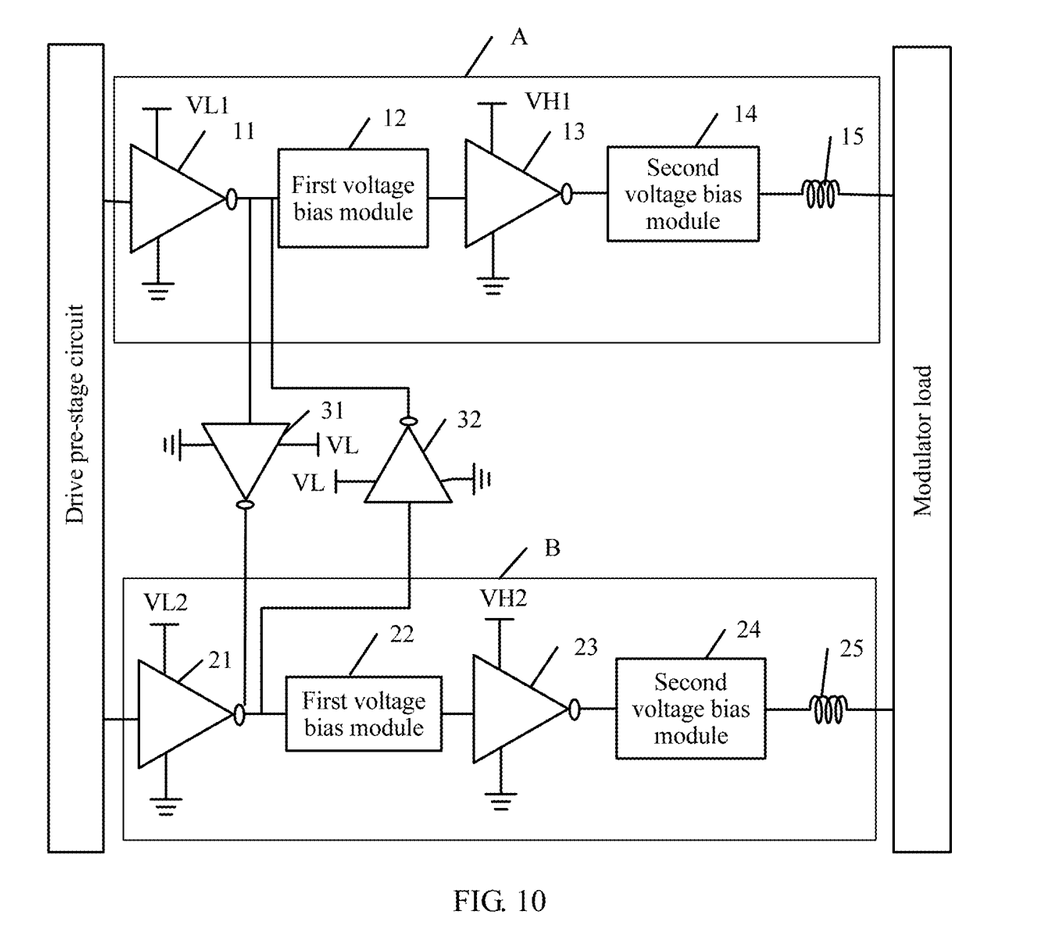
FIG. 10 is a schematic structural diagram of still another high-rate high-swing drive circuit applied to a silicon photonic modulator according to an embodiment of the present application.

Referring to FIG. 10, FIG. 10 is a schematic structural diagram of still another high-rate high-swing drive circuit applied to a silicon photonic modulator according to an embodiment of the present application. The drive circuit shown in FIG. 10 is further refined on the basis of FIG. 4, and in addition to all modules shown in FIG. 4, the drive circuit may further include a fifth inverter 31 and a sixth inverter 32.

An input end of the fifth inverter 31 is connected to the output end of the first inverter 11, an input end of the sixth inverter 32, and the input end of the first voltage bias module 12.

An output end of the fifth inverter 31 is connected to the output end of the third inverter 21, an output end of the sixth inverter 32, and the input end of the third voltage bias module 22.

The input end of the sixth inverter 32 is connected to the input end of the first voltage bias module 12.

The output end of the sixth inverter 32 is connected to the output end of the third voltage bias module 22.

In this embodiment of the present application, the fifth inverter 31 and the sixth inverter 32 are mainly configured to amplify a signal output by the first inverter 11 and a signal output by the third inverter 21.

In this embodiment of the present application, electronic components that make up the fifth inverter 31 and the sixth inverter 32 are the same, and are all the same as electronic components of the first inverter 11. The fifth inverter 31 and the sixth inverter 32 have a same working voltage, and each include a core PMOS and a core NMOS.

In conclusion, the first inverter 11, the third inverter 21, the fifth inverter 31, and the sixth inverter 32 each has a relatively high data transmission rate, and each has a working voltage less than that of the second inverter. The first inverter 11 and the third inverter 21 are configured to buffer the signal output by the drive pre-stage circuit. The fifth inverter 31 and the sixth inverter 32 are weak inverters, and are configured to ensure that a crossing point of the signals output by the first inverter 11 and the third inverter 21 is at approximately 50%. Working voltage values of the second inverter 13 and the fourth inverter 23 are greater than a working voltage value of the first inverter 11. Because an output voltage value of the second inverter 13 is approximately equal to a current working voltage value, a total voltage value that is loaded onto the modulator load by using the drive circuit shown in FIG. 10 is two times the working voltage value of the second power supply.

In this embodiment of the present application, it should be noted that the inductor 15 and the inductor 25 may be an inductor integrated in a chip, or may be a parasitic inductor generated by means of package, such as a bonding wire inductor, a bonding ball welding inductor, or the like. Alternatively, the inductor 15 and the inductor 25 each may include both the inductor integrated in the chip and the parasitic inductor generated by means of package.

In this embodiment of the present application, according to a model of an MZM load, an optimal inductance value from an output end of the drive circuit to an MZM input end may be obtained by means of simulation. In this embodiment, an inductance value 100 pH to 150 pH of the inductor may meet a performance requirement, and the inductance value 100 pH to 150 pH may be ensured within a whole error range.

In the embodiments of the present application, a high-rate high-swing output signal can be obtained by implementing the foregoing drive circuits.

It should be noted that, for brief description, the foregoing method embodiments are represented as a series of actions. However, a person skilled in the art should appreciate that the present application is not limited to the described order of the actions, because according to this application, some steps may be performed in other orders or simultaneously. It should be further appreciated by a person skilled in the art that the embodiments described in this specification all belong to example embodiments, and the involved actions and modules are not necessarily required by this application.

In the foregoing embodiments, the description of each embodiment has respective focuses. For a part that is not described in detail in an embodiment, reference may be made to related descriptions in other embodiments.

The modules in the drive circuits in the embodiments of the present application may be combined, divided, and deleted according to an actual requirement.

The foregoing describes in detail a high-rate high-swing drive circuit applied to a silicon photonic modulator according to the embodiments of the present application. In this specification, specific examples are used to describe the principle and implementations of the present application, and the description of the embodiments is only intended to help understand the method and core idea of the present application. Meanwhile, a person of ordinary skill in the art may, based on the idea of the present application, make modifications with respect to the specific implementations and the application scope. Therefore, the content of this specification shall not be construed as a limitation to the present application.

What is claimed is:

1. A high-rate high-swing drive circuit applied to a silicon photonic modulator, wherein the drive circuit is connected to a drive pre-stage circuit and a modulator load, the drive circuit comprises at least one output circuit, and the output circuit comprises: a first inverter, a first voltage bias circuit, a second inverter, a second voltage bias circuit, and an inductor;

an input end of the first inverter is connected to an output end of the drive pre-stage circuit;

an output end of the first inverter is connected to an input end of the first voltage bias circuit;

an output end of the first voltage bias circuit is connected to an input end of the second inverter;

an output end of the second inverter is connected to an input end of the second voltage bias circuit;

an output end of the second voltage bias circuit is connected to an input end of the inductor; and an output end of the inductor is connected to an input end of the modulator load, wherein the first inverter comprises a core P-type metal-oxide semiconductor field-effect transistor (PMOS) and a core N-type metal-oxide semiconductor field-effect transistor (NMOS), wherein:

a gate electrode of the core PMOS is connected to the output end of the drive pre-stage circuit and a gate electrode of the core NMOS;

a drain electrode of the core PMOS is connected to a drain electrode of the core NMOS and the input end of the first voltage bias circuit;

a source electrode of the core PMOS is connected to a first power supply;

the gate electrode of the core NMOS is connected to the output end of the drive pre-stage circuit;

the drain electrode of the core NMOS is connected to the input end of the first voltage bias circuit; and a source electrode of the core NMOS is grounded.

2. The drive circuit according to claim 1, wherein the first voltage bias circuit comprises a first capacitor and a first resistor;
- a first end of the first capacitor is connected to the drain electrode of the core PMOS and the drain electrode of the core NMOS; and
- a second end of the first capacitor is connected to a first end of the first resistor and the input end of the second inverter, and a second end of the first resistor is connected to a first bias voltage.

3. The drive circuit according to claim 2, wherein the second inverter comprises: an input/output P-type metal-oxide semiconductor field-effect transistor (I/O PMOS) and an input/output N-type metal-oxide semiconductor field-effect transistor (I/O NMOS);
- a gate electrode of the I/O PMOS is connected to the second end of the first capacitor, the first end of the first resistor, and a gate electrode of the I/O NMOS;
- a drain electrode of the I/O PMOS is connected to the input end of the second voltage bias circuit and a drain electrode of the I/O NMOS;
- a source electrode of the I/O PMOS is connected to a second power supply;
- the gate electrode of the I/O NMOS is connected to the second end of the first capacitor and the first end of the first resistor; and
- the drain electrode of the I/O NMOS is connected to the input end of the second voltage bias circuit, and a source electrode of the I/O NMOS is grounded.

4. The drive circuit according to claim 3, wherein the second voltage bias circuit comprises a second capacitor and a second resistor;
- a first end of the second capacitor is connected to the drain electrode of the I/O PMOS and the drain electrode of the I/O NMOS;
- a second end of the second capacitor is connected to a first end of the second resistor and the input end of the inductor; and
- a second end of the second resistor is connected to a second bias voltage.

5. The drive circuit according to claim 1, wherein the first inverter is configured to buffer an output signal of the drive pre-stage circuit.

6. The drive circuit according to claim 5, wherein the first voltage bias circuit is configured to adjust a bias voltage of amplified buffered signal that is buffered by the first inverter.

7. The drive circuit according to claim 5, wherein the second inverter is configured to amplify a signal obtained after the first voltage bias circuit performs bias processing.

8. The drive circuit according to claim 7, wherein the second voltage bias circuit is configured to adjust a bias voltage of an amplified signal that is amplified and output by the second inverter.

9. The drive circuit according to claim 1, wherein a working voltage value of the first power supply is less than a working voltage value of a second power supply.

10. The drive circuit according to claim 9, wherein the inductor comprises at least one of an inductor built in a chip or a parasitic inductor generated by means of package.

11. The drive circuit according to claim 10, wherein the inductor and the modulator load form an LC bandwidth extension circuit.

* * * * *